United States Patent [19]

Jacino et al.

[11] 4,200,478
[45] Apr. 29, 1980

[54] GLASS BREAK REPAIR APPARATUS AND METHOD

[76] Inventors: Gerald Jacino, 87-43 115 St., Richmond Hill, N.Y. 11418; Anthony Jacino, 17 Normandie LA., East Moriches, N.Y. 11940

[21] Appl. No.: 910,457

[22] Filed: May 30, 1978

[51] Int. Cl.² .............................................. B32B 35/00
[52] U.S. Cl. ........................................ 156/94; 65/28; 128/224; 156/102; 156/104; 156/382; 264/36; 425/11; 425/12; 425/13; 428/63
[58] Field of Search ................ 29/401 E, 402; 65/28; 156/94, 102, 104, 381, 382; 264/36; 425/11, 12, 13, 14; 428/63; 128/215, 218 M, 224, 329 R; 222/306

[56] References Cited

U.S. PATENT DOCUMENTS

| | | | |
|---|---|---|---|
| 3,562,366 | 2/1971 | Sohl .................................. | 264/36 X |
| 3,765,975 | 10/1973 | Hollingsworth .................. | 156/94 |
| 3,993,520 | 11/1976 | Werner et al. .................... | 156/94 |
| 4,032,272 | 6/1977 | Miller ............................... | 156/94 X |
| 4,047,863 | 9/1977 | McCluskey et al. ............. | 156/94 X |
| 4,132,516 | 1/1979 | Story ................................ | 156/94 X |

Primary Examiner—John T. Goolkasian
Assistant Examiner—Robert A. Dawson
Attorney, Agent, or Firm—Auslander & Thomas

[57] ABSTRACT

A glass break apparatus and method includes a pedestal which forms an airtight seal to a syringe and to the glass over the break. The flange on the pedestal enables the gripping and sealing.

12 Claims, 10 Drawing Figures

GLASS BREAK REPAIR APPARATUS AND METHOD

The present invention relates to a glass break repair apparatus and method.

Glass breaks or cracks, such as in automobile windshields, or even plate glass, mar the visibility through the glass, but oftentimes do not affect the usability of the glass. In many instances, such breaks or cracks themselves can be repaired, substantially restoring the visibility through the glass, obviating expensive time-consuming replacement of the entire glass which includes the break or crack.

One of the problems in glass breaks or cracks is that the rough edges of the area and the crack striations refract light in patterns different from the normal refraction of the glass, impeding or destroying the normal visibility of the glass.

The problems of glass breaks are substantially the same in automobile windshields or plate glass insofar as visibility is concerned. The main difference between a windshield and plate glass is that a windshield or other automobile glass is made of safety glass.

Safety glass is usually a lamination of two plates of glass sandwiching a transparent binder, a crack in a windshield usually only affects the outer plate of the lamination and does not go through the entire lamination.

A crack in the plate glass differs primarily in that it goes through the entire plate, since there is no lamination.

It has been found that glass breaks can be filled with transparent resins which protect the formerly broken areas and which substantially restore the visibility to the repaired area. Such repair has required complicated, expensive equipment and usually could not be done except by professionals using such equipment. A car owner with a break in a windshield for instance, had to find a specialist to repair the break since the equipment of the past was either too expensive to be purchased to repair only a single break and could only justify itself economically by reuse. The equipment was also so complicated that only experienced operators could use such equipment.

Notwithstanding equipment of the past and professional repairs, oftentimes striations of somewhat irregular cracks were unable to be properly repaired because of the difficulty of getting the resin to penetrate the striations of the crack.

Devices of the past required heat applications, ultra sound, pressure to place the devices or vacuum mounted jigs to position repair apparatus, among other things.

According to the present invention a simple pedestal is mountable over a break. The pedestal receives a syringe which seals itself by friction to the pedestal and is used to fill the crack with transparent resin. Where the break is through the entire thickness of the glass, it may be necessary to seal the other side of the glass in order to get proper resin penetration.

The pedestal and syringe may be discarded after use.

The flange on the pedestal serves as an effective interface between the seal and the glass with the break.

Although such novel feature or features believed to be characteristic of the invention are pointed out in the claims, the invention and the manner in which it may be carried out, may be further understood by reference to the description following and the accompanying drawings.

Referring now to the figures in greater detail, where like reference numbers denote like parts in the various figures.

The glass repair apparatus 10 comprises a pedestal and a syringe. The pedestal 11 is mounted on a seal 13 which may be elastomeric, which may be centered over a break 14 in a glass.

Figure 2:
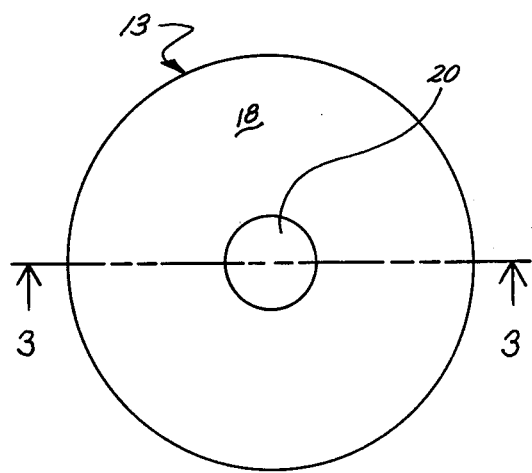
FIG. 2 is a plan view of a pedestal seal.
Figure 3:
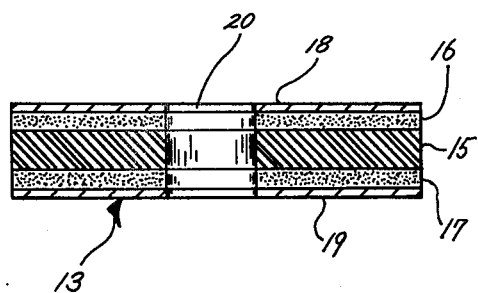
FIG. 3 is a section of FIG. 2 along lines 3—3.

The seal 13 preferably is provided separate from the pedestal 11 and can be seen in FIG. 3. It includes several lamina. There is a basic layer of an air impermeable substance such as rubber, with two adhesive layers 16, 17 covered by protective release papers 18, 19. As can be seen in FIG. 2, there is a central opening 20 in the seal 13.

The pedestal 11 preferably has a flange portion 21 and a neck 22 which includes a chamber 23. The neck 22 includes a recessed portion 24 over which rests an "O" ring seal 25.

The syringe 12, preferably of plastic, is provided with a collar 26 which may be engaged by friction over the recessed portion 24 of the neck 22 in sealing engagement with the neck 22 and the "O" ring 25.

Figure 1:
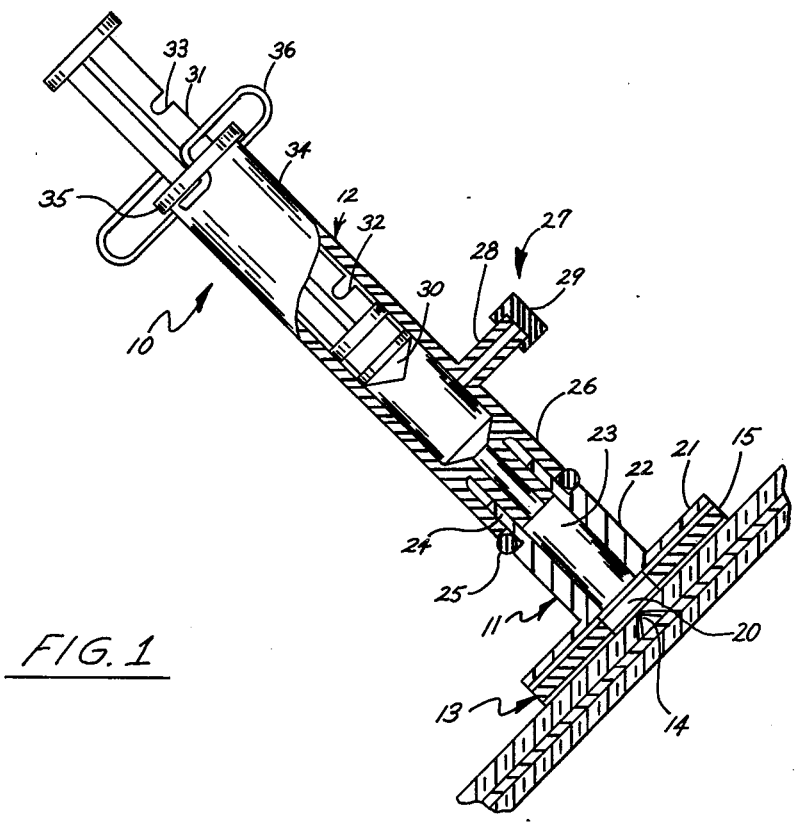
FIG. 1 is a partially cut-away section of a broken glass with a pedestal and syringe mounted for repair.

The syringe 12 near its lower portion has a valve 27. In the embodiment shown in FIG. 1, the valve 27 comprises a stem 28 and a cap 29 which fits over the stem 28. The syringe 12 has a conventional plunger 30 on a stem 31. The stem 31 usually has an "X" cross section and preferably includes a lower notch 32 and an upper notch 33. On the body 34 of the syringe 12, the conventional flange 35 preferably includes latch 36.

Figure 4:
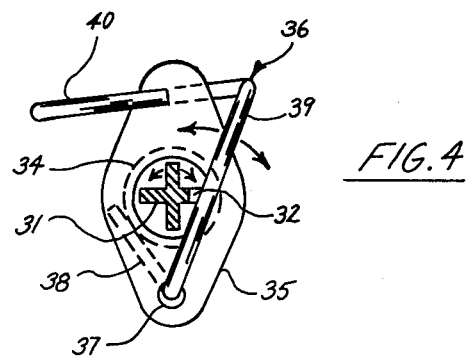
FIG. 4 is a a detail top view of a syringe latch of the present invention.

The latch 36 can be seen in FIG. 4 as it pivots through an opening 37 in the flange 35 and has a lower arm 38 biased against the body 34. The upper arm 39 is normally biased against the stem 31. The upper arm 39 is formed into a keeper 40 folded over the flange 35 to limit the motion of the latch 36. The bias of the latch 36 causes it to engage the notch 32 or notch 33, according to the position of the stem 31. Disengagement is obtained by rotation of the stem 31 one way or the other as indicated in FIG. 4, which flexes the latch 36 on the unnotched portion of the stem to cause disengagement.

Figure 5:
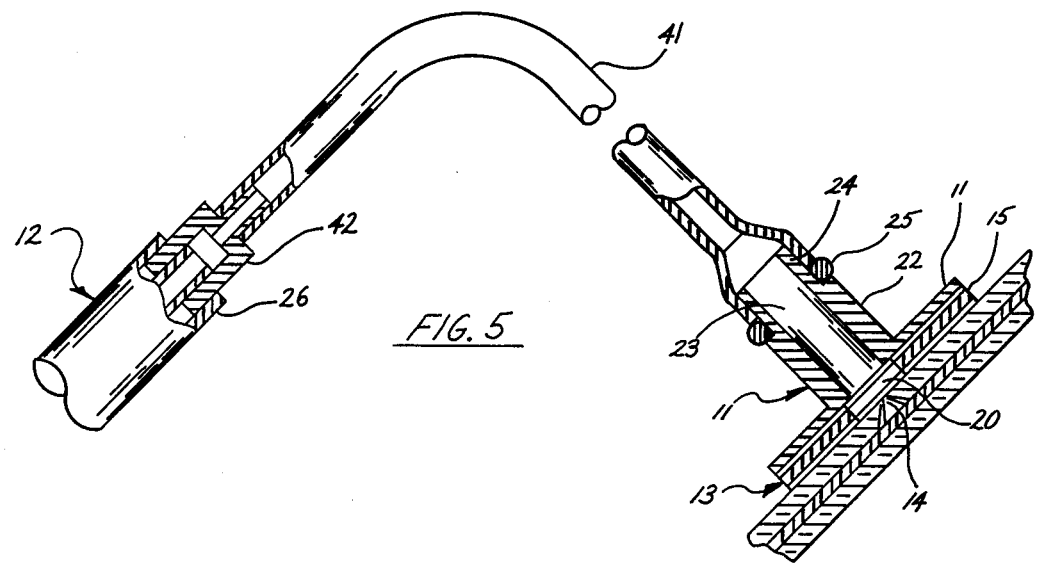
FIG. 5 is a detail of a remote extension from the pedestal to the syringe of the present invention.

In FIG. 5 a tube 41 is shown engaging the neck 22 and leading to a remote syringe 12 where the tube 41 ends in a connector 42 which engages the collar 26 of the syringe 12.

Figure 7:
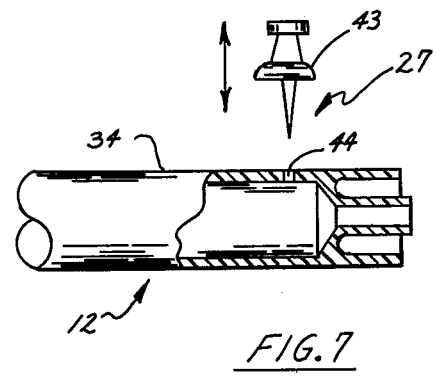
FIG. 7 is a view of the syringe with a variant valve.
Figure 8:
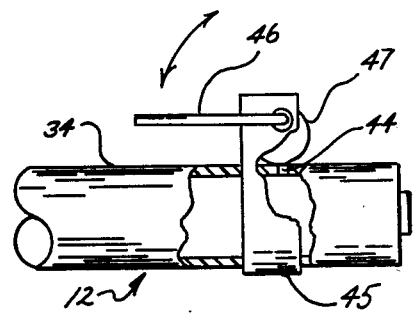
FIG. 8 is a side detail of another embodiment of a variant valve.
Figure 9:
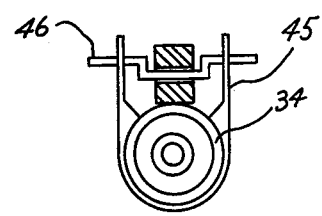
FIG. 9 is a front elevation of FIG. 8.

In FIG. 7 the valve 27 comprises a pin 43 which fits into the opening 44. In FIGS. 8 and 9 a sleeve 45 is shown which fits over the body 34 of the syringe 12. The sleeve 45 includes a lever 46 with a stopper 47 in eccentric engagement to cover or uncover the opening 44.

Figure 6:
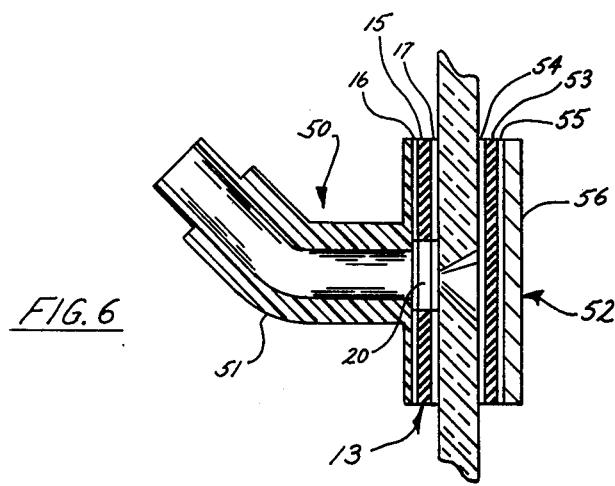
FIG. 6 is a section view of a pedestal of the present invention and seal for repairing plate glass.

In the repair of vertical standing glass or plate glass, it may be necessary to use a pedestal 50 as shown in FIG. 6 which has an elbow neck which may receive a syringe 12. Where a break, as shown on a piece of plate glass in FIG. 6, is through the entire piece of glass, it is necessary to provide an airtight back seal 52. The back seal 52 comprises a basic patch 53 similar to the layer 15 of the seal 13 with adhesive layers 54, 55. The outside layer 55 adheres to a tape support 56 which may be integral to the patch 53 construction or separately applied.

In repairing a break on a windshield, for instance, release paper 19 is removed from the seal 13. The seal 13 is preferably centered over the center of the break.

Oftentimes breaks, particularly in windshields, form a pinpoint with a loose cone of glass inside. The present invention is not limited to repairing such limited types of breaks. As long as the seal 13 can form an airtight seal between the open cracks in the glass, the apparatus and method are effective.

Once the seal 13 is placed, the remaining paper 18 is removed and the pedestal 11 is engaged with the adhesive layer 16 with the chamber 23 over the opening 20 in the seal 13. The resin is then placed in the body 34 of the syringe, usually by removing the plunger 30 and putting the resin into the open end of the syringe.

The resin is preferably a transparent epoxy. A hardener is mixed in. The epoxy is selected to be clear. The mixture is gauged to not cure too fast so that there is enough time to cycle the resin into the break. Epoxy has been mentioned by example. It is believed that other resins might serve the same purpose as epoxy.

Once the resin is in and the plunger 30 is replaced, the syringe 12 is ready for use. The collar 26 of the syringe 12 is then engaged by friction on the neck 22 of the pedestal 11. Engaging the syringe 12 with the "O" ring 25 is an effective precaution against any air leakage in or out.

The air in the break must be removed in order for the resin to flow into the break and also fill the striations of the break.

The first step is to open the valve 27 and depress the plunger 30 as far it can go, then close the valve 27 and withdraw the plunger 30 and engage the notch 32 with the latch 36. Where the pedestal is transparent the air from the break can be seen bubbling through the resin. This is also helpful where the resin is a two-part epoxy, since it helps mix the resin. After ten to fifteen minutes or after the bubbles seem to diminish, the plunger 30 may be pushed downward and locked, held in notch 33 to place a pressure to force the remaining resin into the break and the striations.

It is preferable to proceed to additional vacuum cycles by opening the valve 27, depressing the plunger 30, closing the valve 27, then withdrawing the plunger 30 and re-engaging the notch 32 with the latch 36.

The vacuum cycle both draws out the air and replaces it with the resin. The vacuum cycle will get much of the resin into the break and even into the striations. The resin, once in the striations, gives a uniform refraction and generally clear visibility through the striation and the break.

Once the vacuum cycles seem sufficient by inspection or experience, it is preferable to open the valve 27, allow air into the body 34 of the syringe 12, then close the valve 27 and depress the plunger 30, then engage the notch 33 in the latch 36. This final step forces the resin into the small cracks and striations. This step should take five to ten minutes. In the final step the pressure may be maintained until the resin has fully penetrated.

The resin continually thickens. Ultimately, the pressure has little or no effect. At this time the syringe 12 may be removed.

Figure 10:
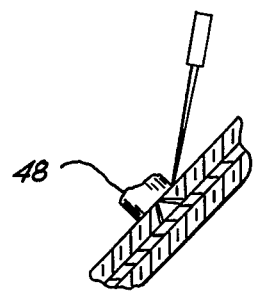
FIG. 10 is a detail of a residual bead on a repaired glass.

It may be desirable to leave the pedestal 11 on until the resin is fully cured. The chamber 23 acts as a reservoir to hold the resin and mold a bead 48. When the resin is fully cured, the pedestal 11 is removed and the bead 48 is left. The head 48 can be removed as shown in FIG. 10 by cutting with a razor, leaving a smooth surface with the glass and good visibility through the repaired break.

At any time, the progress of the work can be checked by observing what is taking place from the opposite side of the glass. The centering of the seal 13 may be double-checked from the opposite side also.

It may be desirable, though, to carefully watch each step from the opposite side of the glass. When that is desirable, the following steps are taken. After the placement of the pedestal 11, the resin is placed in the chamber 23 then a tube 41 is placed over the neck 22. The outer end of the tube 41 is attached to a connector 42 which is then attached to a syringe 12 which is shown in FIG. 5. The next step can be carried out such as from inside an automobile while watching the windshield with the syringe 12 at the remote end of the tube 41.

Where the hole is through the entire glass, such as plate glass, as shown in FIG. 6, it is preferable to use a pedestal 50 with an elbow 51. The elbow 51 assures that the level of the resin will be high enough to fill the entire break. In order to provide a closure to the break in the glass, a sealing patch 53 is applied on the opposite surface of the break. It is preferable to have a support 56 over the patch so that the vacuum cycle does not suck part of the patch into the break, leaving an indentation in the repair. The support 56 may be a piece of aluminum or steel for instance, or even a piece of Masonite. Masonite is a registered trademark for a fiberboard.

The seal 13 is preferably applied separately because its opening 20 allows centering over the break. The seal 13 could be integral to the pedestal 11.

The vacuum and pressure cycles of the present invention enable the resin to penetrate for longer distances into radiating irregular striations of a break. The present invention does more than just repair simple bullseye type breaks.

The syringe 12 and pedestal 11, if carefully cleaned, may even be reusable. The simplicity and economy of the parts, though make it easily disposable and usable on a one-time repair basis as a kit of the syringe 12, pedestal 11 and seal 13 with the resin.

The terms and expressions which are employed are used as terms of description; it is recognized, though, that various modifications are possible.

It is also understood the following claims are intended to cover all of the generic and specific features of the invention herein described; and all statements of the scope of the invention which as a matter of language, might fall therebetween.

Having described certain forms of the invention in some detail, what is claimed is:

1. An apparatus for repairing a break in class comprising a pedestal, said pedestal including a flange portion, a chamber, said chamber in said pedestal, said chamber having two openings, one said opening in said flange portion, said other opening including means adapted to receive a syringe in airtight engagement, said chamber of sufficient size to act as a reservoir for glass repair resin, adhesive sealing means, said adhesive sealing means adapted to directly seal said pedestal at said flange in airtight engagement over a break in glass with said chamber in substantial communication with said glass break, and a syringe, said syringe having a lower end engagable at said other chamber opening, said syringe including valve means near its lower end, a plunger with a stem, retaining means on the body of said syringe, said retaining means adapted to selectively retain said stem and hold said stem in fixed position.

2. The invention of claim 1 wherein said valve means includes an opening and a pin.

3. The invention of claim 1 wherein said valve means includes a tube and a cap.

4. The invention of claim 1 including a sleeve on said body, said sleeve including a lever and a stopper mounted eccentrically on said lever, said stopper adapted to close said valve means in said syringe.

5. The invention of claim 1 including a plunger with a stem, a latch on the body of said syringe and means to interengage said latch with said stem.

6. The invention of claim 1 including a tube interposed in airtight engagement between said syringe and said pedestal.

7. The invention of claim 1 wherein said opening adapted to receive said syringe is on an elbow.

8. The invention of claim 7 in combination with a second adhesive seal, said second adhesive seal adapted to seal a further side of a break in glass.

9. The invention of claim 8 wherein said seal second adhesive includes a support.

10. A method for repairing a break in glass comprising the steps of sealing a pedestal over a break in said glass, said pedestal including a flange portion, a chamber, said chamber in said pedestal, said chamber having two openings, one said opening in said flange portion, said other opening including means adapted to receive a syringe in airtight engagement, said chamber of sufficient size to act as a reservoir for glass repair resin, adhesive sealing means, said adhesive sealing means adapted to directly seal said pedestal at said flange in airtight engagement over a break in glass with said chamber in substantial communication with said glass break, emplacing a syringe, said syringe having a lower end engagable at said other chamber opening, said syringe including valve means near its lower end, a plunger with a stem, retaining means on the body of said syringe, said retaining means adapted to selectively retain said stem and hold said stem in fixed position, a flowable hardenable resin in said syringe, and creating a vacuum in said syringe to exhaust air from said break and allow the flow of resin into said break.

11. The invention of claim 10 repeating the steps of opening said valve, depressing said plunger, closing said valve, withdrawing said plunger and locking it in withdrawn position.

12. The invention of claim 10 including the steps of opening said valve, closing said valve, then depressing said plunger, then locking said plunger in depressed position.

* * * * *